United States Patent [19]
Morelos-Zaragoza et al.

[11] Patent Number: 6,134,696
[45] Date of Patent: Oct. 17, 2000

[54] ENCODING AND DECODING RATE-1/N CONVOLUTIONAL CODES AND THEIR PUNCTURED VERSIONS

[75] Inventors: Robert Morelos-Zaragoza, Sunnyvale; Advait Mogre, Fremont, both of Calif.

[73] Assignee: LSI Logic Corporation, Milpitas, Calif.

[21] Appl. No.: 09/087,459

[22] Filed: May 28, 1998

[51] Int. Cl.[7] .................................................. H03M 13/03
[52] U.S. Cl. ........................ 714/790; 714/795; 375/262; 375/341
[58] Field of Search ..................................... 714/787, 788, 714/789, 795, 790, 792, 793, 794; 370/347, 377, 465; 348/409; 375/245, 259, 262, 295, 340, 341, 377; 341/50, 94

[56] References Cited

U.S. PATENT DOCUMENTS

| | | | |
|---|---|---|---|
| 4,562,467 | 12/1985 | Bradley | 348/409 |
| 4,675,871 | 6/1987 | Gordon et al. | 714/789 |
| 5,438,590 | 8/1995 | Tzukerman | 375/259 |
| 5,511,082 | 4/1996 | How et al. | 714/790 |
| 5,982,761 | 11/1999 | Dutta | 370/377 |

*Primary Examiner*—Emmanuel L. Moise

[57] ABSTRACT

The present invention is directed to the encoding and decoding of a digital signal. The encoding process results in a rate-1/n convolutional code derived from a rate-1/2 convolutional code. The process includes: selecting a base convolutional encoding rate of rate-1/l, where l is an integer; selecting an output encoding rate of 1/n, where n is an integer greater than 1; encoding an input digital signal into a convolutional code comprised of signals $S(0)$ through $S(l-1)$, the convolutional code having the rate 1/l convolutional code encoding rate; and providing a rate-1/n convolutional code, which is derived from the rate-1/l convolutional code, the rate-1/n convolutional code having $N(i)$ copies of the rate-1/l signals $S(i)$, where i is from 0 through $l-1$ and where the sum of $N(i)$ is equal to n. The decoding process results in a digital signal estimated from received symbols which include rate-1/n convolutional code generated by the above encoding process and any noise that may have been introduced by a transmission medium. The process includes the step of: generating a signal pair from the received symbols, the signal pair having a first signal and a second signal which are suitable for decoding by a rate-1/2 convolutional decoder. The first signal is an average of a sum of encoded signals which correspond to positions in the rate-1/2 convolutional code encoded using a first generator polynomial. The second signal is an average of a sum of encoded signals which correspond to positions in the rate-1/n convolutional code encoded using a second generator polynomial. The method also includes a step of decoding the signal pairs using a rate-1/2 convolutional decoder.

23 Claims, 4 Drawing Sheets

ENCODING AND DECODING RATE-1/N CONVOLUTIONAL CODES AND THEIR PUNCTURED VERSIONS

BACKGROUND OF THE INVENTION

1. Field of the Invention

The present invention relates to digital communication systems. More particularly, the present invention relates to encoding rate-1/n convolutional codes derived from a standard rate 1/2 convolutional code and decoding the rate-1/n convolutional codes, including their punctured versions.

2. The Background Art

Referring first to FIG. 1, a typical digital communications system 10 having a signal transmission portion 12, a communication channel 14 on a communications medium, and a receiving portion 16 is shown. Digital signal 18 is received and encoded by convolutional encoder 20 and is then sent to modulator 22 through nodes A and B as a convolutional code 24. Modulator 22 modulates convolutional code 24 resulting in modulated signals 26 which are transmitted through communication channel 14, or an equivalent transmission medium. Modulated signals 26 may then be received by receiving portion 16 and demodulated by demodulator 28, resulting in a stream of symbols 30 which are passed through nodes C and D to a convolutional decoder 32. Decoder 32 decodes symbols 30 by estimating an output digital signal 34 from symbols 30.

Symbols 30 are demodulated signals which represent convolutional code 24 and "noise" introduced by transmission medium used. Those of ordinary skill in the art would recognize that the convolutional code and noise content in symbols 30 may be expressed in terms of a signal to noise ration, which may or may not have a gaussian distribution.

Convolutional encoders are known in the art and are used to encode digital signals so as to maximize the signal to noise ratio of the encoded signals when transmitted through a transmission channel or equivalent transmission medium. Convolutional codes include redundant symbols used to increase the signal to noise ratio. This minimizes the probability of errors introduced during encoding.

For example, encoder 20 may be a rate-1/2 convolutional encoder which generates a stream of convolutional code having two output bits for every input bit received by the rate-1/2 encoder. A rate-1/3 convolutional encoder generates a stream of convolutional code having three output bits for every input bit received. Consequently, a rate 1/n convolutional encoder generates convolutional code comprised of n output bits for every one input bit, where the n output bits may be represented as S(0) through S(n−1).

Each of the n output bits generated by a rate-1/n convolutional encoder is a function of a generator polynomial. Thus, a rate-1/n convolutional encoder relies on n different generator polynomials, one polynomial for each output bit generated for a corresponding input bit.

Received convolutional code, such as convolutional code 30, is usually estimated with a convolutional decoder. One type of convolutional decoder known by those of ordinary skill in the art is a Viterbi decoder. For proper operation, the decoder used must have the same rate as the rate used to encode the digital signal and must be tailored for the choice of generator polynomials used to encode the digital signal. For instance, a digital signal encoded by a rate-1/2 convolutional encoder, which uses two different generator polynomials, is decoded with a rate-1/2 decoder tailored to estimate the received symbols, which are comprised of a rate-1/2 convolutional code and noise introduced by a transmission medium, using the same generator polynomials used by the rate-1/2 encoder. Similarly, a rate-1/3 convolutional encoder, which uses three different generator polynomials, is decoded with a rate-1/3 decoder tailored to estimate the received symbols using the same three generator polynomials used by the rate-1/3 decoder. Consequently, a traditional decoder is selected to have the same rate as the rate of the received symbols and is specifically tailored to receive symbols based on the generator polynomials used by the encoder that generated the convolutional code represented by the symbols.

Since standard convolutional coding techniques decrease the rate of the signals that may be transmitted over a given bandwidth, "puncturing" may be used to increase the rate of signals transmitted over a given bandwidth. Puncturing is known in the art and is a process whereby encoded bits, which are redundant, may be systematically removed, increasing the rate of the transmitted bits ("throughput"). When used in conjunction with the encoding technique above, this increase in throughput mitigates the reduction in the original signal rate by the encoding process.

Punctured signals, such as punctured convolutional code, must be "de-punctured" before decoding. For example, referring to FIG. 2A, if a convolutional code is punctured using a puncturing module 36 coupled between encoder 20 and modulator 22 through nodes A and B of FIG. 1, a corresponding "de-puncturing" module 38 (See FIG. 2B) must also be used. De-puncturing module 38 would be inserted between demodulator 28 and decoder 32 between nodes C and D so that the received symbols are de-punctured before they are decoded by decoder 32.

Accordingly, a need exists for encoding a rate-1/n convolutional code derived from a rate-1/2 convolutional code and its punctured versions, where n may be any integer greater than two.

Furthermore, a need exists for decoding a rate-1/n convolutional code derived from a rate-1/2 convolutional code and its punctured versions, where n may be any integer greater than two.

Furthermore, a need exists for a device, which has a fixed-rate decoder and which may be used in a digital communication system, that does not need to be specifically tailored to the generator polynomials used to generate rate-1/n convolutional code derived from a rate-1/2 convolutional code in order to properly decode symbols representing the rate-1/n convolutional code or its punctured versions.

Moreover, a need exists for a device, which has a fixed rate decoder and which may be used in a digital communication system, that does not need to be specifically tailored to the generator polynomials used to generate the convolutional code, while remaining capable of estimating the punctured versions of convolutional code having a rate-1/n, where n may be any integer greater than two.

SUMMARY OF THE INVENTION

In a first aspect of the present invention, a digital communications system, employing an encoder for generating convolutional code derived from a rate-1/2 convolutional code and a decoder capable of estimating digital data from the convolutional code, includes: a rate-1/n encoder responsive to a digital signal, the encoder generating a rate-1/n convolutional code which is derived from a rate-1/2 convolutional code; a modulator responsive to the rate-1/n convolutional code received from said encoder; the modulator modulating the rate-1/n convolutional code so as to generate modulated rate-1/n convolutional code and transmit the modulated rate-1/n convolutional code across a physical transport layer; a demodulator responsive to modulated rate-1/n convolutional code, the demodulator demodulating the modulated rate-1/n convolutional code so as to generate demodulated symbols; an adding and scaling block responsive to the demodulated symbols, the block generating a first signal and a second signal suitable for decoding by a rate-1/2 decoder; and a rate-1/2 convolutional decoder responsive to the first signal and the second signal received from the block.

In a second aspect of the present invention, the rate-1/n decoder may further include: an add and scale module for generating a first signal and a second signal from the rate-1/n convolutional code; and a rate-1/2 convolutional decoder for estimating a digital signal from the first signal and from the second signal.

In a third aspect of the present invention, the digital communication system may further include a puncturing device and a corresponding de-puncturing device.

In a fourth aspect of the present invention, a method for generating rate-1/n convolutional code derived from a rate-1/2 convolutional code includes the steps of: selecting a base convolutional encoding rate of rate-1/l, where l is an integer; selecting an output encoding rate of 1/n, where n is an integer greater than 1; encoding an input digital signal into a convolutional code comprised of signals S(0) through S(l−1), the convolutional code having the rate 1/l convolutional code encoding rate; and providing a rate-1/n convolutional code, which is derived from the rate-1/l convolutional code, the rate-1/n convolutional code having N(i) copies of the rate-1/l signals S(i), where i is from 0 through l−1 and where the sum of N(i) is equal to n.

In a fifth aspect of the present invention, the method for generating rate-1/n convolutional code derived from a rate-1/2 convolutional code above, further includes the step of puncturing the convolutional code.

In a sixth aspect of the present invention, a method for decoding symbols representing rate-1/n convolutional code derived from a rate-1/2 convolutional code includes the steps of: generating a signal pair from the rate-1/n convolutional code, the signal pair having a first signal and a second signal which are suitable for decoding by a rate-1/2 convolutional decoder. The first signal is an average of a sum of encoded signals which correspond to positions in the rate-1/2 convolutional code encoded using a first generator polynomial. The second signal is an average of a sum of encoded signals which correspond to positions in the rate-1/n convolutional code encoded using a second generator polynomial. The method also includes a step of decoding the signal pairs using a rate-1/2 convolutional decoder.

In a seventh aspect of the present invention, a method for decoding de-punctured rate-1/n convolutional code derived from a rate-1/2 convolutional code, which is represented by received symbols, may further include the step of depuncturing the rate-1/n code if the code was punctured before the step of generating.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
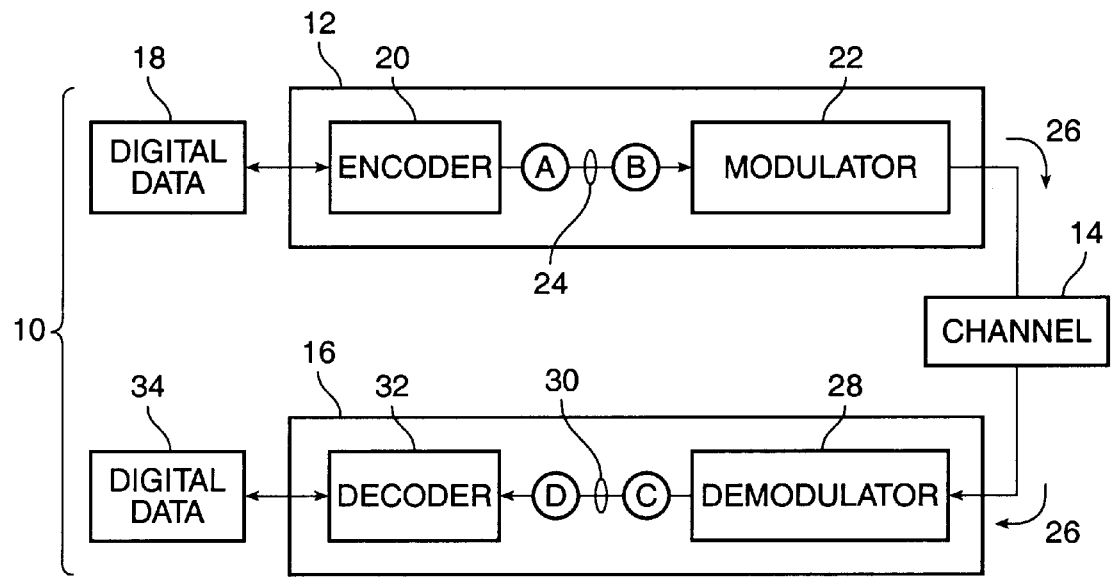
FIG. 1 is a block diagram of a generic digital communication system employing encoding and decoding techniques.
Figure 2A:
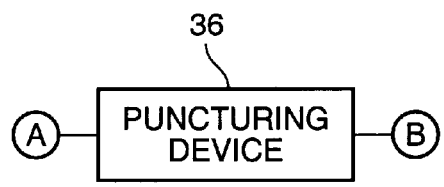
FIG. 2A is a block diagram of a puncturing device which may be used with the digital communication system shown in FIG. 1.
Figure 2B:
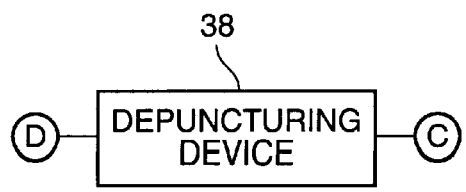
FIG. 2B is a block diagram of a de-puncturing device which may be used with the digital communication system shown in FIG. 1 that has been modified to include the puncturing device shown in FIG. 2A.
Figure 3A:
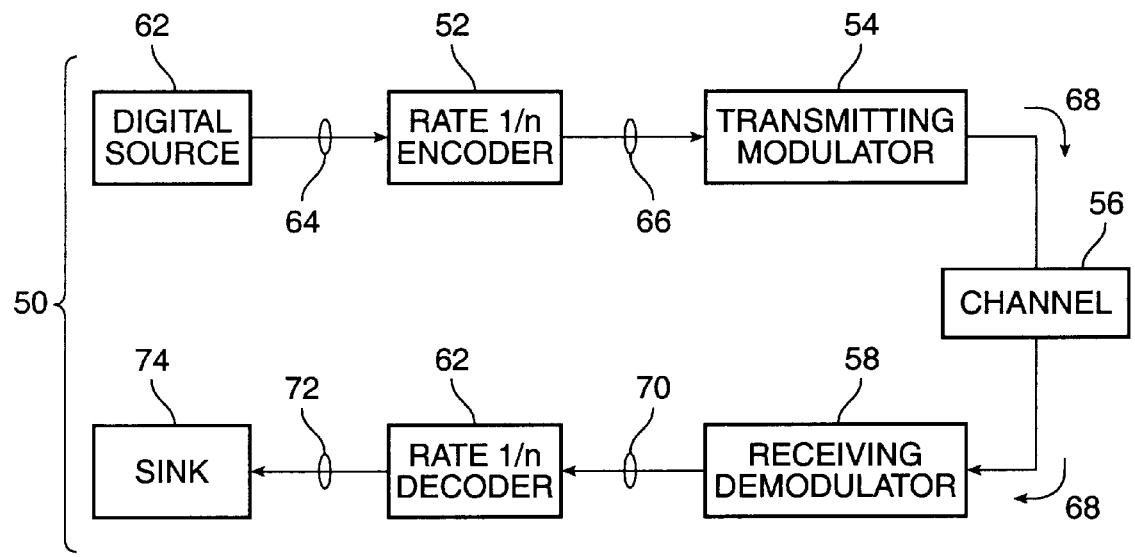
FIG. 3A is a block diagram of a digital communications system employing an encoder for generating convolutional code derived from a rate-1/2 convolutional code and a decoder capable of estimating digital data from the convolutional code in accordance with a presently preferred embodiment of the present invention.

FIG. 3A is a block diagram of a digital communication system employing an encoder for generating convolutional code derived from a rate-1/2 convolutional code and a decoder capable of estimating digital data from the convolutional code in accordance with a presently preferred embodiment of the present invention.

Digital communication system 50 includes a rate-1/n in encoding device 52, a modulator 54, a transmission channel 56, a de-modulator 58, and a rate-1/n decoder 62. Encoding device 52 receives digital signals from a digital source 62 and generates rate-1/n convolutional code 66 derived from a rate-1/2 convolutional code. Modulator 54 receives rate-1/n convolutional code 66 and transmits them as modulated signals 68 through transmission channel 56, or equivalent transport layer. De-modulator 58 receives and demodulates modulated signals 68 and provides demodulated signals 70 in a rate-1/n convolutional code format to rate-1/n decoder 62. Decoder 62 generates digital signals 74 by adding and scaling demodulated signals 70 and by estimating the added and scaled signals using a rate-1/2 convolutional decoder. This results in decoded signals 72 which are then presented to a device for receiving digital signals 74.

In accordance with a presently preferred embodiment of the present invention, transmission channel 56, is a physical transport layer having gaussian characteristics, such as transmission channels used to broadcast digital video signals. This is not intended to limit the present invention in any way. A physical transport layer not having a gaussian transmission characteristic may also be used.

Figure 3B:
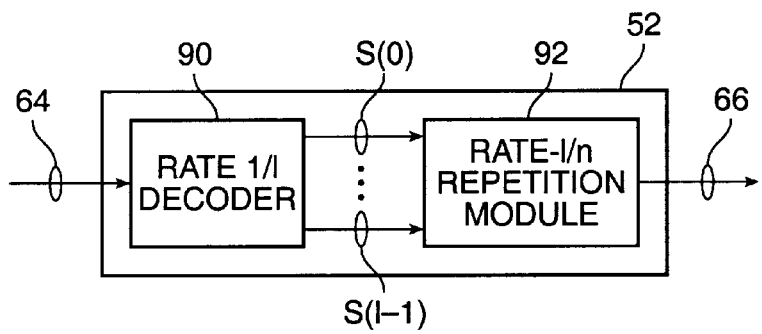
FIG. 3B is a block diagram of a rate-1/n encoder in accordance with a presently preferred embodiment of the present invention.

FIG. 3B is a block diagram of a rate-1/n encoder in accordance with a presently preferred embodiment of the present invention.

Rate-1/n encoder 52 in FIG. 3A is now further described in FIG. 3B and includes a rate-1/l convolutional encoder 90 ("base encoder") and a rate-l/n repetition module 92. Rate-1/l convolutional encoder 90 generates l output bits for every one input bit received, where l is an integer equal to or greater than two. The number of output bits can be generalized as s(i), where i is an integer from zero through l–1. Variable n is any integer greater than l.

Convolutional encoders having rate-1/l use l different generator polynomials to generate s(i) . . . s(l–1) outputs. Each s(i) output having a corresponding but different generator polynomial. For example, for each input bit received, a rate-1/2 encoder will generate convolutional code having a first output bit, s(0), which is encoded using a first generator polynomial, and a second output bit, s(1), which is encoded using a second generator polynomial. Convolutional encoders, alternately known as constraint length encoders or 64 state encoders, are known in the art.

In accordance with a presently preferred embodiment of the present invention, when used with digital communication system 50 having rate-1/n decoder 62, rate-1/l encoder 90 is preferably a rate-1/2 convolutional encoder, i.e., a rate 1/l convolutional encoder where l is equal to two. Moreover, rate-1/2 convolutional encoder preferably uses generator polynomials of 171 and 133 octal for 64 states.

Rate-l/n repetition module 94 repeats each output bits s(i) . . . s(l–1) received from rate-1/l convolutional encoder 90 according to the following equation: N(i) copies of s(i), where i is an integer from zero through l–1 and N(0)+N(1)+ . . . +N(l–1) is equal to n. This results in a rate-1/n convolutional code 94, derived from a rate-1/l convolution code, having n modified output bits for every input bit 96 received by base encoder 92.

In accordance with a presently preferred embodiment of the present invention, l is equal to two and n is equal to three. This results in a rate-1/3 convolution code, which is derived from a rate-1/2 convolutional code having modified output bits of N(0) copies of s(0) and N(1) copies of s(1), where N(0)+N(1) are integers having a sum equal to n. Because n is equal to three, one possible combination includes N(0) equal to one and N(1) equal to two which may be expressed as: one copy of s(0), two copies of s(1).

Other combinations may be used in the present invention and are readily ascertainable from the within disclosure without undue experimentation by those of ordinary skill in the art. For example, a rate-1/4 convolutional code may be derived from a rate 1/2 convolutional code.

Figure 3C:
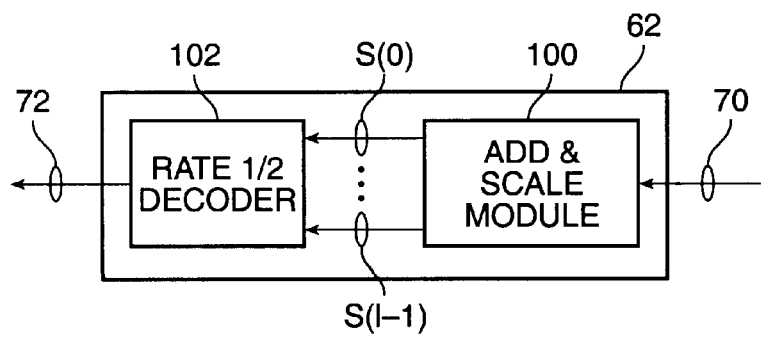
FIG. 3C is a block diagram of a rate-1/n decoder in accordance with a presently preferred embodiment of the present invention.

FIG. 3C is a block diagram of a rate-1/n decoder in accordance with a presently preferred embodiment of the present invention.

Rate-1/n decoder 62 shown in FIG. 3A is now further described in FIG. 3C and includes an add and scale block 100 and a rate-1/2 convolutional decoder 102. Add and scale module 102 receives demodulated signals 70 (which represent rate-1/n convolutional code 66 generated by rate-1/n encoder 52 from a single input bit 64) and performs a binary add and scale to demodulated signals 70. This reduces demodulated signals 70 into a first signal s(0) and a second signal s(1) when the following equations are implemented through add and scale block 100:

$$s(0) = 1/I \sum_{i=0}^{I-1} r(i); \quad s(1) = 1/Q \sum_{j=I}^{n-1} r(j);$$

$$\text{where } I = n(0) \text{ and } Q = n(1).$$

Those of ordinary skill in the art will recognize how to make and use an add and scale block which provide the operations suggested by the above equations.

Rate-1/2 convolutional decoder 102 then estimates a digital signal from first signal s(0) and second signal s(1), completing the decoding process. Rate-1/2 convolutional decoders are known by those of ordinary skill in the art.

In accordance with a presently preferred embodiment of the present invention, demodulated signals include rate-1/n convolutional code derived from a rate-1/2 convolutional code. The base convolutional encoder used must have a base rate of 1/2, i.e., l is an integer equal to two. This permits the rate-1/n decoder to accurately estimate the rate-1/n convolutional code using a rate-1/2 convolutional decoder.

Figure 3D:
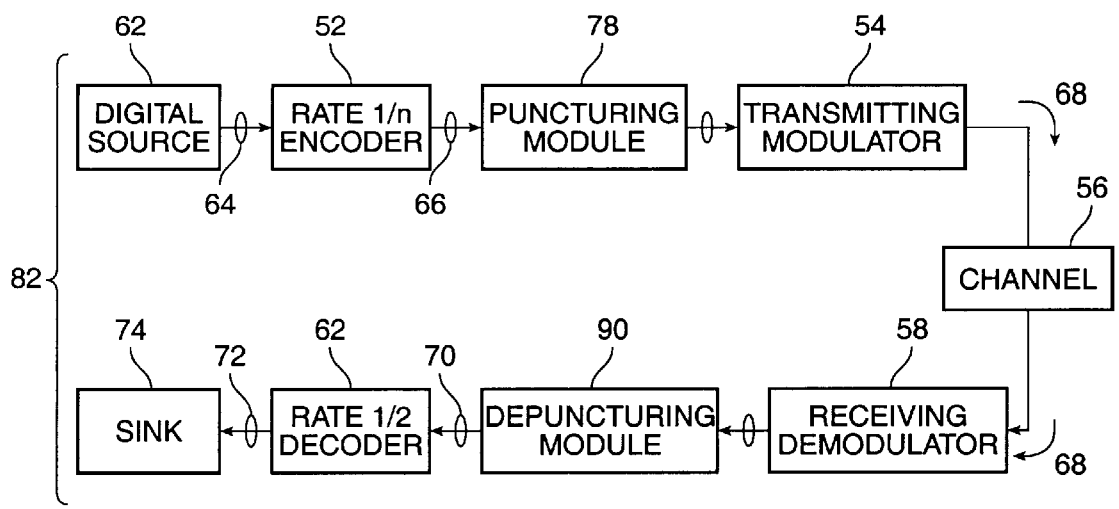
FIG. 3D is a block diagram of digital communication system 82 configured to include a puncturing device and a corresponding de-puncturing device in accordance with an alternative embodiment of the present invention.

In an alternative embodiment of the present invention, digital communications system 50 in FIG. 3A may be modified to include the puncturing and de-depuncturing of the transmitted and received signals, respectively. Such an embodiment is shown in FIG. 3D and includes a puncturing module 78 and a corresponding de-puncturing module 80 resulting in a digital communication system 82.

Figure 4A:
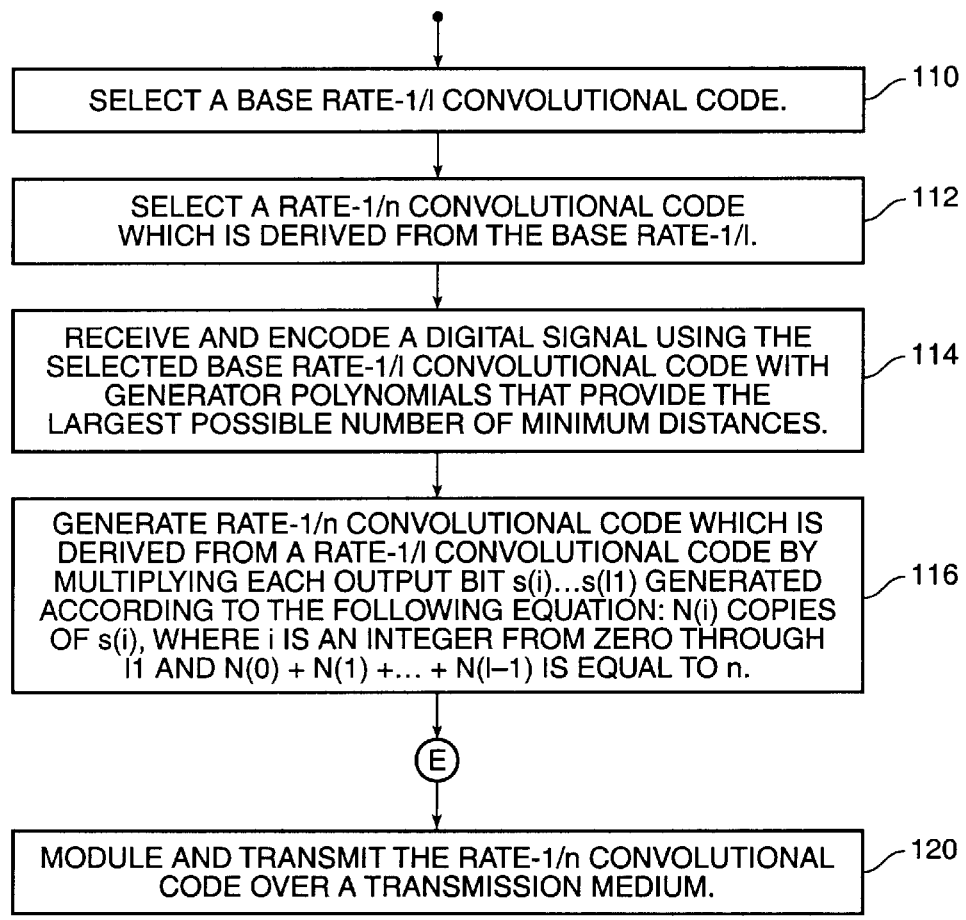
FIG. 4A is a flow diagram describing the steps for generating rate-1/n convolutional code derived from a rate-1/2 convolutional code in accordance with a presently preferred embodiment of the present invention.

FIG. 4A is a flow diagram describing the steps for generating rate-1/n convolutional code derived from a rate-1/2 convolutional code in accordance with a presently preferred embodiment of the present invention.

At step 110, a base convolutional code rate-1/l is selected, where l is an integer greater than or equal to integer two. In accordance with a presently preferred embodiment of the present invention, l is set equal to integer two, resulting in a base convolutional code rate of rate-1/2.

Step 110 may further include using a rate-1/2 convolutional encoder to provide the selected base convolutional code rate of rate-1/2 when l is selected according to the presently preferred embodiment.

At step 112, a rate-1/n convolutional code, which is derived from the base rate-1/l, is selected, where n is an integer greater than l. In accordance with a presently preferred embodiment, n is an integer equal to three.

At step 114, a digital signal is encoded using rate-1/l convolutional code resulting in a rate-1/l convolutional code. In accordance with a presently preferred embodiment of the present invention, encoding is performed with generator polynomials that provide the largest possible number of minimum distances. For example, with l selected to be equal to two, using a first generator polynomial of 171 octal and a second generator polynomial 133 octal results in a rate-1/2 convolutional code having the largest possible number of minimum distances.

Although only one digital signal is used in this discussion, it is not intended to limit the present invention in any way. More than one digital signal may be encoded consecutively but is not so discussed in the interest of clarity.

At step 116, rate-1/n convolutional code which is derived from a rate-1/l convolution code is generated by processing each output bit s(i) . . . s(l–1) generated in step 114 according to the following equation: N(i) copies of s(i), where i is an integer from zero through l–1 and N(0)+N(1)+ . . . +N(l–1)

is equal to n. This results in a convolutional code having n modified output bits for every input bit received.

For example, a rate-1/2 convolutional code encoding rate applied to a digital bit generates a rate-1/2 convolutional code having a first bit S(0) and a second bit S(1) having an encoding scheme corresponding to a first polynomial and a second polynomial.

In accordance with a presently preferred embodiment of the present invention, l is equal to two and n is equal to three. This results in a rate-1/3 convolution code, which is derived from a rate-1/2 convolutional code, having modified output bits include N(0) copies of s(0), N(1) copies of s(1), where N(0)+N(1) are integers having a sum equal to n. Because n is equal to three, one possible combination includes N(0) equal to one and N(1) equal to two which may be expressed as: one copy of s(0), and two copies of s(1).

At step 118, bypassing node E and F, the rate-1/n convolutional code may then be modulated and transmitted on a transmission medium. This results in transmitted signals which when receive include the rate-1/n convolutional code and any noise that might have been introduced by the transmission medium. These received signals are hereafter defined as "symbols." In accordance with a presently preferred embodiment of the present invention, the transmission medium used to transmit the modulated rate-1/n convolution code has a gaussian transmission characteristic.

Figure 4B:
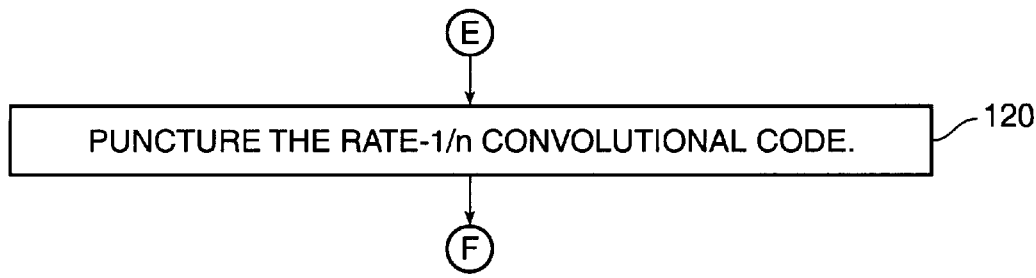
FIG. 4B is a flow diagram describing the steps for generating punctured rate-1/n convolutional code derived from a rate-1/2 convolutional code in accordance with an alternative embodiment of the present invention.

As shown in FIG. 4B, step 120 may be performed after step 116 through node E. At step 120, the stream of output signals are punctured so as to increase the rate of the output signals. Puncturing is known by those of ordinary skill in the art. Step 118 is may then be performed through node F.

Figure 5A:
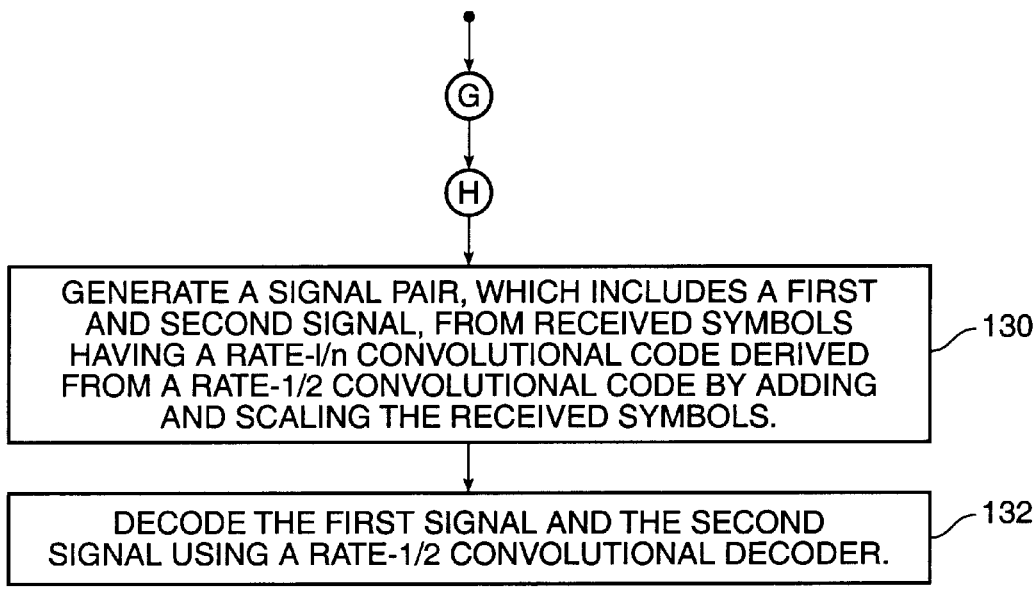
FIG. 5A is a flow diagram describing the steps for decoding symbols representing rate-1/n convolutional code derived from a rate-1/2 convolutional code in accordance with a presently preferred embodiment of the present invention.

FIG. 5A is a flow diagram describing the steps for decoding symbols representing rate-1/n convolutional code is derived from a rate-1/2 convolutional code, and where n is an integer greater than two.

At step 130, bypassing nodes G and H, a pair of signals, comprised of a first signal and a second signal, is generated from received symbols by adding and scaling the rate-1/n convolutional code. The received symbols are comprised of signals that include the rate-1/n convolutional code derived from rate-1/2 convolutional code and noise introduced by the transmission medium used.

In accordance with a presently preferred embodiment of the present invention, adding and scaling the first signal includes summing the values of the encoded signals which correspond to positions in the rate-1/n convolutional code encoded by a first generator polynomial; finding the average of the values; and equating the first signal to the average. This operation may be expressed by the following equation:

$$s(0) = 1/I \sum_{i=0}^{I-1} r(i); \quad \text{where} \quad I = n(0).$$

The adding and scaling of the second signal includes summing the values of the encoded signals which correspond to positions in the stream encoded by a second generator polynomial; finding the average of the values; and equating the second signal to the average. This operation may be expressed by the following equation:

$$s(1) = 1/Q \sum_{j=1}^{n-1} r(j); \quad \text{where} \quad Q = n(1).$$

Step 130 may further include a sub-step of obtaining the first generator polynomial and the second generator polynomial from a set of rate-1/2 generator polynomials.

Step 130 may also further include a sub-step of using generator polynomials of 171 and 133 octal for 64 states, for the first and second generator polynomials, respectively.

At step 132, the first signal and the second signal are decoded using a rate-1/2 convolutional decoder.

Figure 5B:
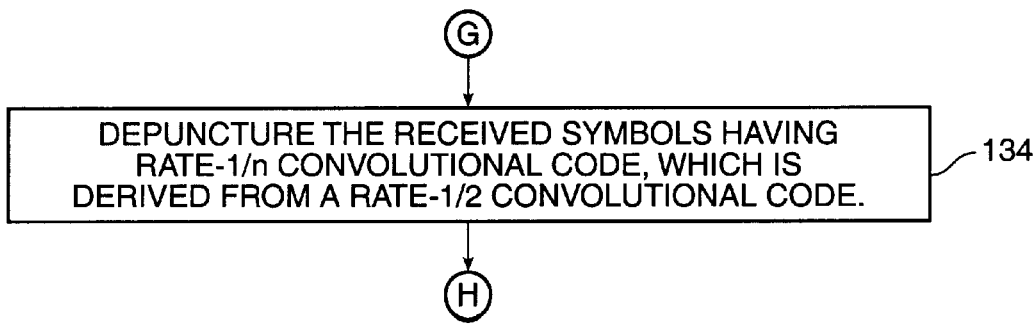
FIG. 5B is a flow diagram describing the steps for decoding de-punctured symbols representing rate-1/n convolutional code derived from a rate-1/2 convolutional code in accordance with a presently preferred embodiment of the present invention.

FIG. 5B is a flow diagram describing the steps for decoding de-punctured symbols representing rate-1/n convolutional code derived from a rate-1/2 convolutional code.

In an alternative embodiment of the present invention, step 134 may be performed before step 130 through node G, if the incoming signals have been punctured. At step 134, the received symbols representing rate-1/n convolutional code, which is derived from a rate-1/2 convolutional code, are de-punctured. Step 130 is then performed through node H.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

We claim:

1. A method for encoding a digital signal which is compatible with a rate-1/l convolution code decoder, said method comprising:

selecting a base convolutional encoding rate of a rate-1/l, where l is an integer;

selecting an output convolutional encoding rate of 1/n, where n is an integer greater than l;

encoding an input digital signal into a rate-1/l convolutional code comprised of a plurality of signals S(0) through S(l−1); and encoding said rate 1/l convolutional code into a rate-1/n convolutional code, said rate-1/n convolutional code having N(i) copies of said rate-1/l signals S(i), where i is from 0 through l−1 and where the sum of N(i) equals n.

2. The method of claim 1, wherein said encoding an input digital signal includes selecting a first set of generator polynomials from a second set of rate 1/l generator polynomials, said first set of generator polynomials yielding an intermediate signal with the largest possible number of minimum distances.

3. The method of claim 1, wherein l equals two.

4. The method of claim 1, wherein said encoding rate of 1/l uses generator polynomials of 171 octal and 133 octal for 64 states.

5. The method of claim 1, wherein n equals three.

6. The method of claim 1, further including a step of puncturing said rate-1/n convolutional code, which is derived from said rate-1/l convolutional code.

7. A method for decoding a symbol representing a rate-1/n convolutional code, which is derived from a rate-1/2 convolutional code, said method comprising:

generating a signal pair from the rate-1/n convolutional code, said signal pair having a first signal and a second signal which are suitable for decoding by a rate-1/2 convolutional decoder, wherein said first signal is an average of a first sum of encoded signals which correspond to positions in the rate-1/n convolutional code encoded by a first generator polynomial, wherein said second signal is an average of a second sum of encoded signals which correspond to positions in the rate-1/n convolutional code encoded by a second generator polynomial; and decoding said signal pair using said rate-1/2 convolutional decoder.

8. The method of claim 7, wherein said first generator polynomial and said second generator polynomial are from a set of rate-1/2 generator polynomials.

9. The method of claim 8, wherein said first generator polynomial and said second generator polynomial are generator polynomials of 171 octal and 133 octal for 64 states, respectively.

10. The method of claim 7, further including a step of depuncturing the rate-1/n encoded signals if said signals were punctured before said step of generating.

11. A method for decoding symbols representing rate-1/n encoded signals by using a rate-1/2 convolutional decoder, said method comprising:

receiving a set of symbols, r(i);

generating a signal pair from said set of symbols, said signal pair having a first signal and a second signal which are suitable for decoding by the rate-1/2 convolutional decoder;

calculating said first signal using a first equation, $$s(0) = 1/I \sum_{i=0}^{I-1} r(i)$$

wherein s(0) is equal to said first signal and I corresponds to the positions of encoded signals encoded by a first generator polynomial;

calculating said second signal using a second equation, $$s(1) = 1/Q \sum_{j=0}^{n-1} r(j)$$

wherein s(1) is equal to said second signal, Q corresponds to the positions of the encoded signals encoded by a second generator polynomial, and the sum of I and Q equals n, where I and Q are integers greater than zero; and decoding said signal pair using the rate-1/2 convolutional decoder.

12. The method of claim 11, wherein said first generator polynomial and said second generator polynomial are from a set of rate-1/2 generator polynomials.

13. The method of claim 12, wherein said first generator polynomial and said second generator polynomial are generator polynomials of 171 octal and 133 octal for 64 states, respectively.

14. The method of claim 11, further including a step of depuncturing the symbols if the symbols were punctured before said step of receiving.

15. The method of claim 11, further including providing the symbols by performing:

modulating a rate-1/n convolutional code derived from a rate-1/2 convolutional encoder so as to generate output signals for transmission;

transmitting said output signals over a transmission medium; and demodulating said output signals so as to provide symbols, said symbols representative of said rate-1/n convolutional code and noise introduced by said transmission medium.

16. A method of operating a digital communication system, said method comprising:

encoding a digital signal so as to generate a rate-1/n convolutional code which is derived from a rate-1/2 convolutional code;

modulating said rate-1/n convolutional code so as to generate modulated rate-1/n convolutional code;

transmitting said modulated rate-1/n convolutional code via a transmission medium, resulting in symbols representing said modulated rate-1/n convolutional code and any noise introduced by said transmission medium;

receiving and demodulating said modulated symbols so as to generate demodulated symbols;

adding and scaling said demodulated symbols so as to generate a signal pair suitable for decoding by a rate-1/2 convolutional decoder; and decoding said signal pairs using said rate-1/2 convolutional decoder.

17. The method in claim 16, wherein said transmission medium has a gaussian transmission characteristic.

18. The method in claim 16, further including the steps of:

puncturing said rate-1/n convolutional code derived from a rate-1/2 convolutional code before said step of transmitting; and depuncturing said demodulated symbols after said step of demodulating.

19. A convolutional code decoder for decoding symbols representing a rate-1/n convolutional code which is derived from a rate-1/2 convolutional code, said rate-1/n convolutional code representing an encoded digital bit, the decoder comprising:

an add and scale module for generating a first signal and a second signal from the rate-1/n convolutional code; and a rate-1/2 convolutional decoder for estimating a digital signal from said first signal and from said second signal.

20. The convolutional decoder of 19, wherein said add and scale module generates said first signal using a first equation, $$s(0) = 1/I \sum_{i=0}^{I-1} r(i)$$

and said second signal using a second equation, $$s(1) = 1/Q \sum_{j=0}^{n-1} r(j).$$

21. A digital communication system, comprising:

a rate-1/n encoder responsive to a digital signal, said encoder generating a rate-1/n convolutional code which is derived from a rate-1/2 convolutional code;

a modulator responsive to said rate-1/n convolutional code received from said encoder; said modulator modulating said rate-1/n convolutional code so as to generate a modulated rate-1/n convolutional code and transmit said modulated rate-1/n convolutional code across a physical transport layer;

a demodulator responsive to modulated rate-1/n convolutional code, said demodulator demodulating said modulated rate-1/n convolutional code so as to generate a demodulated rate-1/n convolutional code;

an adding and scaling block responsive to said demodulated rate 1/n convolutional code, said block generating a first signal and a second signal suitable for decoding by a rate-1/2 decoder; and a rate-1/2 convolutional decoder responsive to said first signal and said second signal received from said block to produce a rate-1/2 code.

22. The system in claim 21, wherein said rate-1/2 convolutional decoder is a Viterbi decoder.

23. The system in claim 21, further including:

a puncturing device for puncturing said rate-1/n convolutional code, said puncturing device coupled between said rate-1/n encoder and said modulator; and a corresponding de-puncturing device for generating de-punctured rate-1/n convolutional code, said de-puncturing device coupled between said demodulator and said rate-1/n decoder.

* * * * *